United States Patent [19]

Perng

[11] Patent Number: 5,506,909
[45] Date of Patent: Apr. 9, 1996

[54] NOISE FILTERING DEVICE

[75] Inventor: Yuh-Jy Perng, Taipei, Taiwan

[73] Assignee: Jet Man Enterprise Co., Ltd., Taipei, Taiwan

[21] Appl. No.: 247,253

[22] Filed: May 23, 1994

[51] Int. Cl.$^6$ ........................................ H04B 15/00
[52] U.S. Cl. ........................ 381/94; 336/175; 336/176
[58] Field of Search ..................... 381/94, 77; 336/175, 336/176

[56] References Cited

U.S. PATENT DOCUMENTS

| | | | |
|---|---|---|---|
| 4,970,476 | 11/1990 | Kitagawa | 336/175 |
| 5,373,277 | 12/1994 | Naito | 336/175 |

*Primary Examiner*—Wing F. Chan
*Assistant Examiner*—Minsun Oh
*Attorney, Agent, or Firm*—Morton J. Rosenberg; David I. Klein

[57] ABSTRACT

A noise filtering device includes an upper casing member and a mating lower casing member, each defining a recess with a flexible flange disposed along the periphery thereof for receiving therein a magnet having inclined side surfaces. The flexible flange is bent inward to abut against the inclined side surfaces of the magnet so as to securely hold the magnet within the recess of each of the casing members. A connection member which is constituted by a portion of each of the casing members and has ends respectively secured to the casing members is provided to hold the casing members together along one side thereof so as to allow the casing members to be rotatable relative to each other about the connection member. A groove is formed on each of the magnets and extending from one side of the casing members to the opposite side to allow a signal wire to be received therebetween to extend through the noise filtering device. A pin is formed on an edge of the upper casing members, having an expanded free end to insert into a hole, having a complementary shape, formed on a confronting edge of the lower casing to secure the upper casing to the lower casing so as to hold the signal wire between the magnets disposed in the casing members.

2 Claims, 4 Drawing Sheets

NOISE FILTERING DEVICE

FIELD OF THE INVENTION

The invention relates generally to a noise filtering device and in particular to a magnetic noise filtering device used to eliminate negative interference of surrounding electromagnetic field induced in the environment in which electrical or electronic appliances are used.

BACKGROUND OF THE INVENTION

Electrical signal lines are commonly used nowadays to connect and transfer electrical signals between different electrical or electronic appliances. Due to the presence of the environmental electromagnetic field, electrical noises are very easy induced in the signal lines which deteriorates the quality of signal transferring and consequently negatively affects the performance of the electrical or electronic appliances.

To overcome the problem of electrical noise induced by the surrounding electromagnetic field, there are noise filtering devices available in the market. An example of the currently available noise filtering devices is shown in FIGS. 7 and 8 of the accompanying drawings. As shown, the currently available noise filtering device, which is designated by the reference A in FIGS. 7 and 8, generally comprises a casing constituted by two members B and C which are connected by thin and flexible connections D so as to be rotatable relative to each other and thus openable. Each of the casing members B and C has a recess into which a magnet 1A is disposed.

The magnets 1A have a groove 1B formed thereon to allow signal wire of which the electrical noise induced thereon by surrounding electromagnetic field is to be eliminated by the noise filtering device A to extend therethrough.

The conventional noise filtering device, however, has disadvantages. Some of the disadvantages are:

(1) The casing members B and C are secured together, when closed, by hooks and slots formed thereon, which hooks and slots are basically weak members and require manufacturing precision and thus causing manufacturing difficulty.

(2) The magnets 1A are simply disposed in the recesses formed on the casing members B and C without any retaining means so that due to the manufacturing tolerance of casing members B and C, the magnets 1A may be easy to disengage from the casing members B and C and thus causing an inconvenience to the users.

(3) the casing members B and C are connected together by weak connections D which may be broken easily if the casing members B and C are repeatedly opened and closed.

(4) The opening of the casing members B and C requires certain complicated operation of the hooks and slots and thus causing an inconvenience to the users.

It is therefore desirable to provide a noise filtering device of the type described previously which removes the deficiencies of the prior art devices.

SUMMARY OF THE INVENTION

Thus, the principal objective of the present invention is to provide a noise filtering device which has fastening means of simple structure.

Another objective of the present invention is to provide a noise filtering device which has a strong connection member connecting between the casing members.

It is a further objective of the present invention to provide a noise filtering device which has magnet retaining means for securely holding the magnets within the recesses formed on the casing members.

To achieve the above-mentioned objective, there is provided a noise filtering device, comprising an upper casing member and a mating lower casing member, each defining a recess with a flexible flange disposed along the periphery thereof for receiving therein a magnet having inclined side surfaces. The flexible flange is bent inward to abut against the inclined side surfaces of the magnet so as to securely hold the magnet within the recess of each of the casing members. A connection member which is constituted by a portion of each of the casing members and has ends respectively secured to the casing members is provided to hold the casing members together along one side thereof so as to allow the casing members to be rotatable relative to each other about the connection member. A groove is formed on each of the magnets and extending from one side of the casing members to the opposite side to allow a signal wire to be received therebetween to extend through the noise filtering device. A pin is formed on an edge of the upper casing members, having an expanded free end to insert into a hole, having a complementary shape, formed on a confronting edge of the lower casing to secure the upper casing to the lower casing so as to hold the signal wire between the magnets disposed in the casing members.

BRIEF DESCRIPTION OF THE DRAWINGS

Other objectives and advantages of the invention will be apparent from the following description of a preferred embodiment of the present invention taken in connection with the accompanying drawings, wherein.

DETAILED DESCRIPTION OF THE PREFERRED EMBODIMENT

Figure 1:
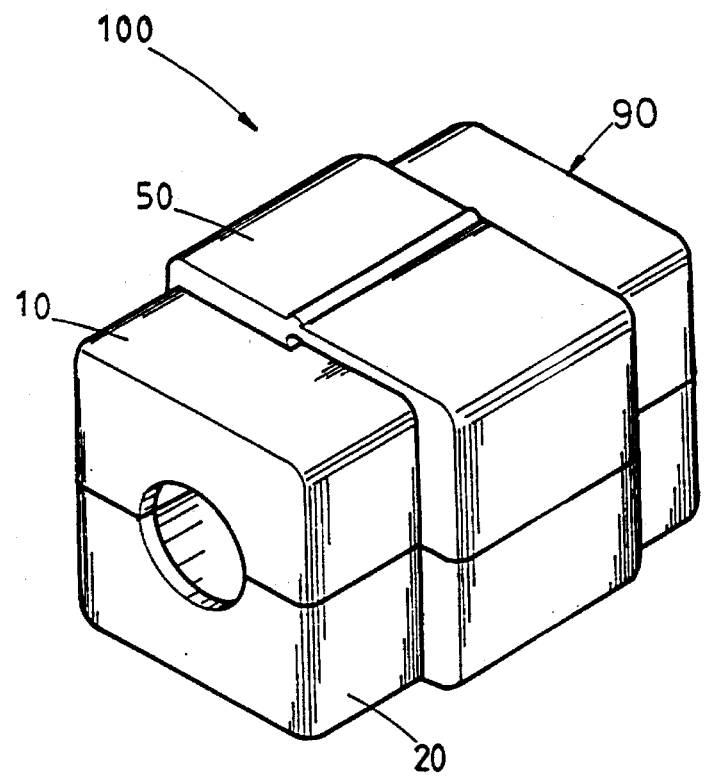
FIG. 1 is a perspective view showing a noise filtering device constructed in accordance with the present invention in a closed condition.
Figure 6:
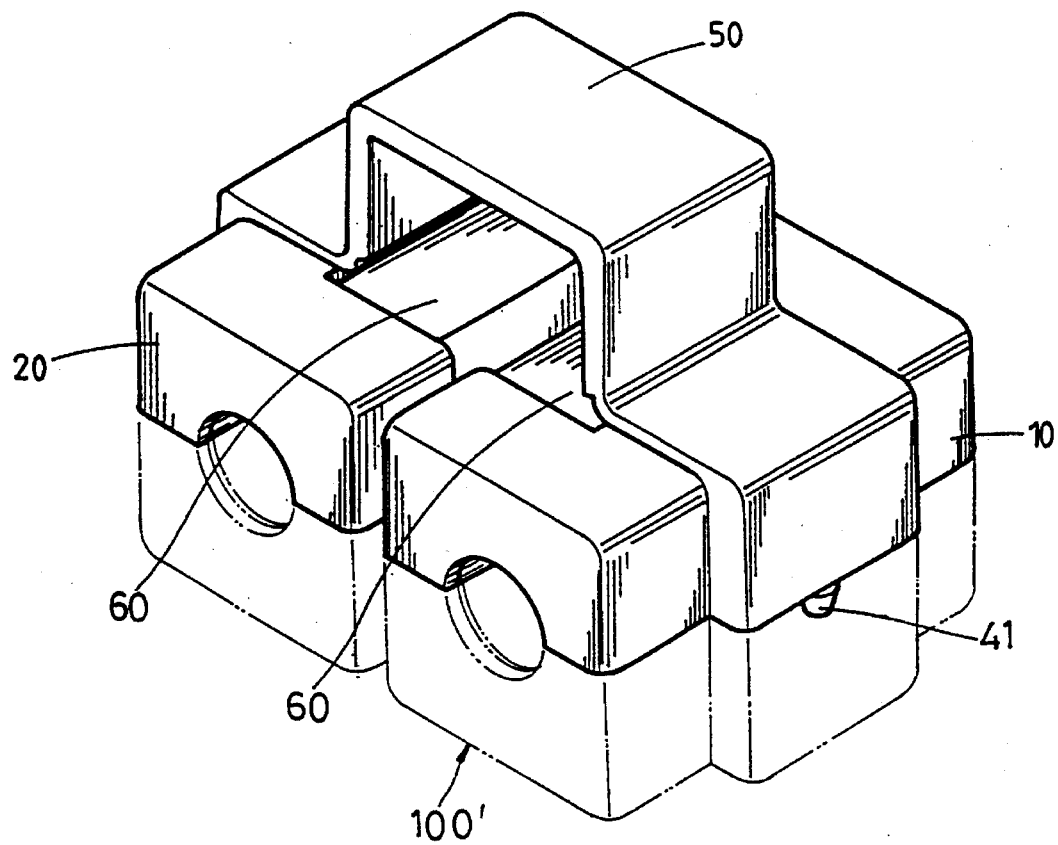
FIG. 6 is a perspective view showing the noise filtering device of the present invention in a fully opened condition which allows the noise filtering device to be mated and coupled by a similar noise filtering device of the present invention to serve as a noise filtering device for a double line signal wire.
Figure 7:
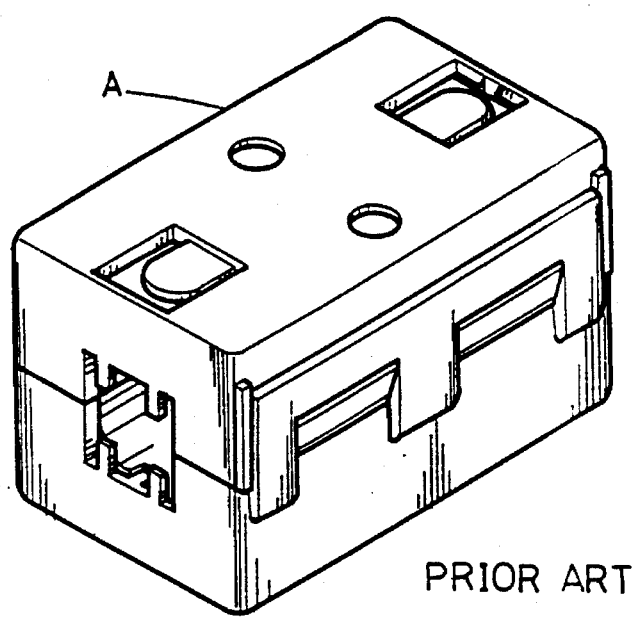
FIG. 7 is a perspective view showing a prior art noise filtering device in a closed condition.
Figure 8:
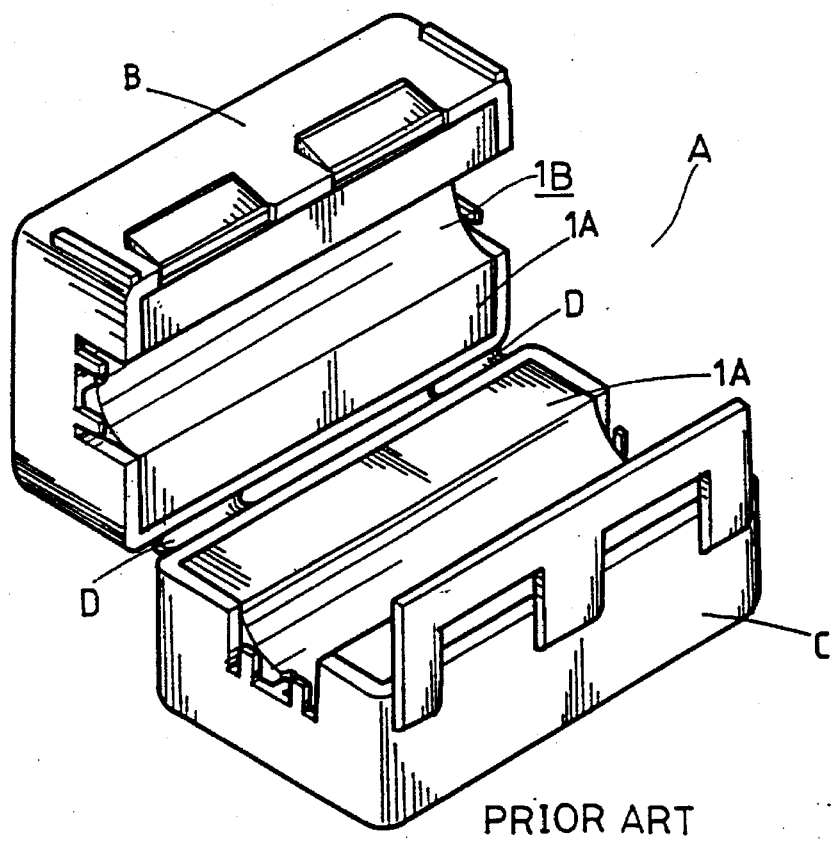
FIG. 8 is a perspective view showing the prior art noise filtering device in an opened condition.

With reference to the drawings and in particular to FIG. 1, wherein a noise filtering device constructed in accordance with the present invention, generally designated with reference numeral 100, is shown, the noise filtering device 100 comprises a casing 90 constituted by an upper casing member 10 and a mating lower casing member 20 which are connected together by a connection member 50 partially surrounding both the upper and lower casing members 10 and 20 and having two ends respectively secured to the upper and lower casing members 10 and 20 so as to allow the upper and lower casing members 10 and 20 to be rotatable relative to each other between a closed condition, shown in FIG. 1, and an open condition, shown in FIG. 6.

Figure 2:
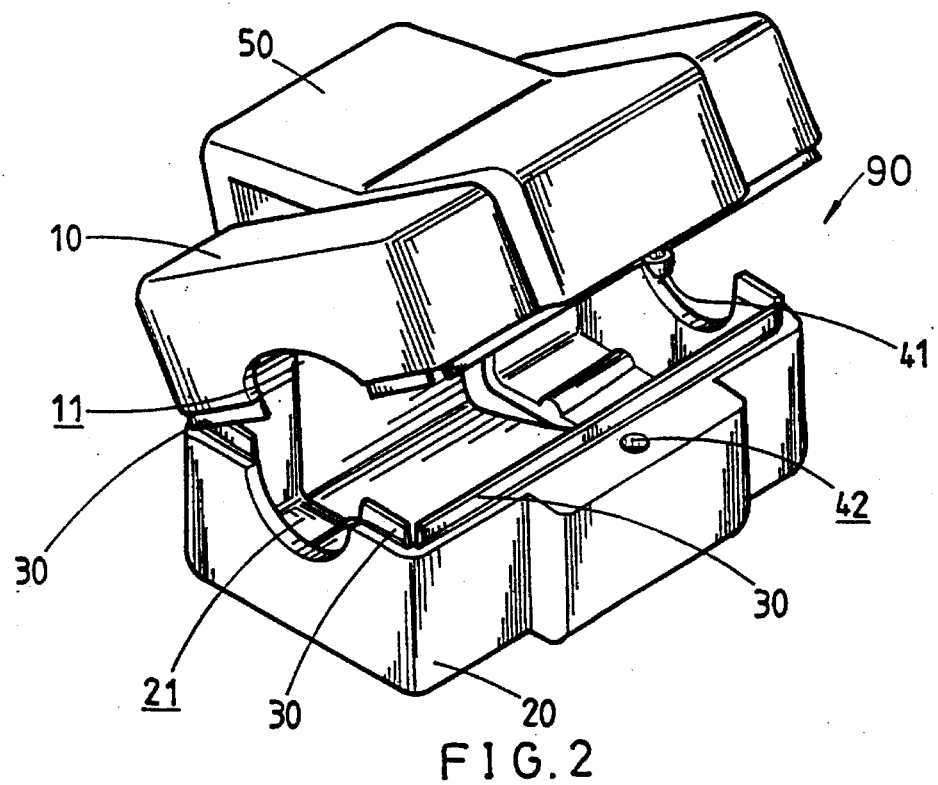
FIG. 2 is a perspective view showing the casing of the noise filtering device of the present invention, with no magnet disposed therein, in a partially opened condition.

The casing 90 of the noise filtering device 100 of the present invention is particularly shown in FIG. 2 in a partially opened condition. Each of the upper and lower casing members 10 and 20 has formed therein a recess 11 or 21. Along periphery of each of the recesses 11 and 21, flexible flange strips 30 are formed which are so flexible that they are capable to be bent relative to the upper and lower casing members 10 and 20.

Each of the casing members 10 and 20 has a pair of opposing notches 10' or 20', preferably semi-circular in shape, formed thereon and directly opposite to each other for receiving therebetween a signal wire (not shown) of which the electrical noise induced by the surrounding electromagnetic field is to be eliminated.

Figure 5:
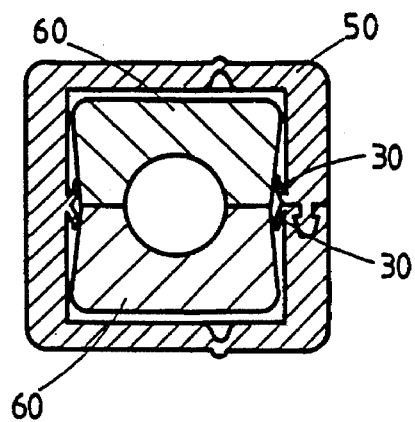
FIG. 5 is a cross-sectional view showing the noise filtering device of the present invention in the closed condition.

Fastening means is provided on the casing members 10 and 20 to secure the casing members 10 and 20 together in the closed condition of FIG. 1. As illustrated in FIG. 2, the fastening means comprises a pin 41 formed on an confronting edge 40 of one of the casing members, for example the upper casing member 10, and pointing toward the corresponding confronting edge 40 of the other casing member, the lower casing member 20 in this case. The pin 41 has an expanded free end to be forcibly inserted into a corresponding hole 42 formed on the confronting edge 40 of the lower casing member 20 which, as best seen in FIG. 5, has a neck at the opening thereof so as to securely hold the pin 41 therein when the expanded free end of the pin 41 is forced to enter therein. The snap-in fastening means may be made of slightly deformable material so as to allow the fastening means to be re-openable.

Figure 3:
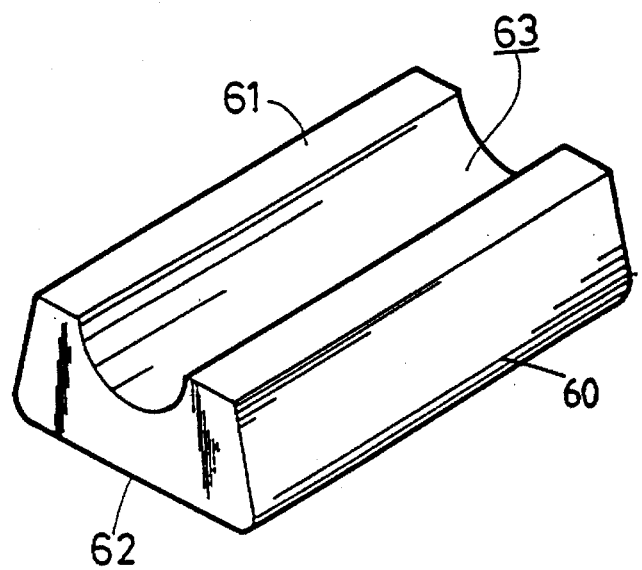
FIG. 3 is a perspective view showing the shape of a magnet adapted in the noise filtering device of the present invention.
Figure 4:
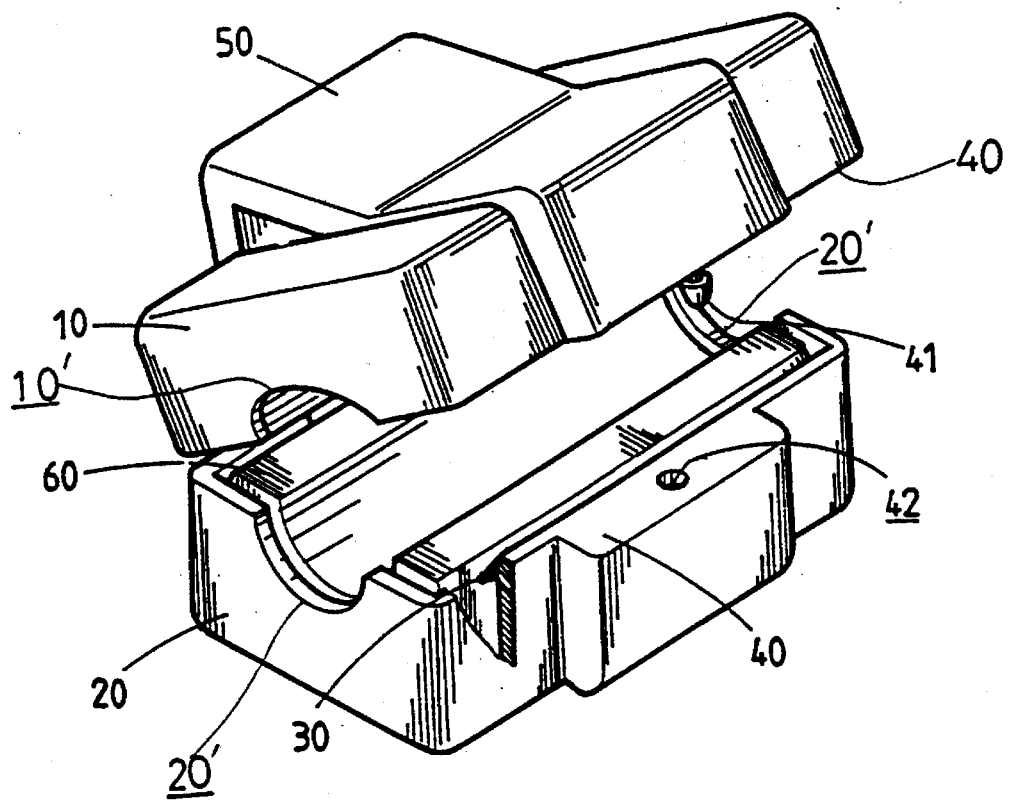
FIG. 4 is a perspective view showing the noise filtering device of the present invention, with the magnets disposed within the casing thereof, in a partially opened condition.

The noise filtering device 100 of the present invention further comprises a magnet 60, which is separately shown in FIG. 3, disposed within each of the recesses 11 and 21 of the casing members 10 and 20. The magnet 60 has such a shape that the top surface 61 thereof is smaller than the bottom surface 62 and the four sides, at least some of them, are inclined toward the top surface 61. A groove 63, preferably semi-circular in cross section, is formed on the top surface 61 of the magnet 60, extending from one side to the opposite side, corresponding to the notches 10' and 20' of the casing members 10 and 20 so as to allow the signal wire to extend through the noise filtering device 100 of the present invention.

The flexible flanges 30 are bent inward when the magnets 60 are displaced into the recesses 11 and 21 of the casing members 10 and 20 to abut against the inclined sides of the magnets 60 so as to securely hold the magnets 60 within the casing members 10 and 20. This is best seen in FIG. 5.

To save material used to form the casing 90, the connection member 50 may be formed by portions of the upper and lower casing members 10 and 20 which are partially separated from the other portions of the casing members 10 and 20 with end sections thereof connected to the casing members 10 and 20 so as to hold the casing members 10 and 20 together. This is best seen in FIG. 6, wherein the upper and lower casing members 10 and 20 are rotated relative to each other to fully open the noise filtering device 100.

The fully opened noise filtering device 100 as shown in FIG. 6 may be coupled with another one of the fully opened noise filtering device 100', as shown by the dashed line of FIG. 6, by having the pin 41 of one of the noise filtering devices received within the hole 42 of the other one. In this way, the noise filtering devices 100 and 100' may be used to handle a double line signal wire (not shown).

It is apparent that although the invention has been described in connection with the preferred embodiment, those skilled in the art may make changes to certain features of the preferred embodiment without departing from the scope of the invention as defined in the claims.

What is claimed is:

1. A noise filtering device comprising:

a pair of magnets, each of said pair of magnets having opposing top and bottom surfaces and a pair of side surfaces extending therebetween, said top surface having a smaller area than said bottom surface with at least one of said pair of side surfaces being inclined, each of said pair of magnets having a longitudinally directed recess formed in said top surface and extending between opposing ends thereof;

an upper casing member having a cavity defined by respective internal surfaces of an upper wall, a pair of opposing side walls and a pair of longitudinally spaced first end walls for receipt of a first of said pair of magnets therein, each of said pair of first end walls having a notch formed therein disposed in aligned relationship with said recess of said first magnet, said upper casing having a first flexible flange formed about a perimeter portion of said cavity and inclined toward said cavity to contact said pair of side surfaces of said first magnet and thereby retain said first magnet within said cavity;

a lower casing member having a cavity defined by respective internal surfaces of a lower wall, a pair of opposing side walls and a pair of longitudinally spaced second end walls for receipt of a second of said pair of magnets therein, each of said pair of second end walls having a notch formed therein disposed in aligned relationship with said recess formed in said second magnet, said lower casing having a second flexible flange formed about a perimeter portion of said cavity and inclined toward said cavity of said lower casing member to contact said pair of side surfaces of said second magnet and thereby retain said second magnet within said cavity;

a connection member respectively coupled on opposing ends thereof to said upper casing member and said lower casing member, said connection member having a first end coupled to an intermediate portion of an external surface of said upper wall of said upper casing member by a first integral hinge and a second end coupled to an intermediate portion of an external surface of said lower wall of said lower casing member by a second integral hinge, said connection member having an intermediate portion overlying a first of said pair of side walls of each said upper and lower casing members, wherein said upper and lower casing members are each rotatable relative to said connection member about said respective first and second integral hinges; and fastening means coupled to a second of said pair of side walls of each said upper casing member and said lower casing member for securing one to the other.

2. The noise filtering device as recited in claim 1 where said second side wall of said lower casing member has a opening formed therein, said opening having an upper neck portion of a first diameter and an expanded lower portion having a second diameter, said second diameter being greater than said first diameter, said fastening means including a pin extending from an edge of said second side wall of said upper casing member in aligned relationship with said opening, said pin having a deformable enlarged distal end for secure engagement within said opening.

* * * * *